(12) United States Patent
Mandal (10) Patent No.: US 7,106,635 B1
(45) Date of Patent: Sep. 12, 2006

(54) BITLINE BOOSTER CIRCUIT AND METHOD

(75) Inventor: Gurupada Mandal, Santa Clara, CA (US)

(73) Assignee: Sun Microsystems, Inc., Santa Clara, CA (US)

(*) Notice: Subject to any disclaimer, the term of this patent is extended or adjusted under 35 U.S.C. 154(b) by 170 days.

(21) Appl. No.: 10/769,130

(22) Filed: Jan. 29, 2004

(51) Int. Cl.
*G11C 7/00* (2006.01)

(52) U.S. Cl. .................. 365/189.11; 365/203

(58) Field of Classification Search ........... 365/189.11, 365/203
See application file for complete search history.

(56) References Cited

U.S. PATENT DOCUMENTS 4,982,367 A * 1/1991 Miyatake .................. 365/203
5,115,412 A * 5/1992 Tobita .................. 365/189.09
5,173,877 A * 12/1992 Flannagan et al. .......... 365/190
5,255,235 A * 10/1993 Miyatake .................... 365/210

* cited by examiner

*Primary Examiner*—Michael T. Tran
(74) *Attorney, Agent, or Firm*—Gunnison, McKay & Hodgson, L.L.P.; Philip J. McKay (57) ABSTRACT

A circuit and method for boosting bitline performance uses a bitline booster circuit to allow long bitlines, with large numbers of memory cells attached, to discharge to a digital zero in a faster time. One bitline booster circuit requires only two additional NOR gates, two additional transistors, and one additional control signal. Consequently, the bitline booster circuit does not require a significant number of added components, does not require multiple control signals and takes up minimal additional silicon area.

10 Claims, 5 Drawing Sheets

BITLINE BOOSTER CIRCUIT AND METHOD

FIELD OF THE INVENTION

The present invention relates to memory arrays and bitlines with attached memory cells. More particularly, the invention relates to a circuit and method for boosting bitline performance.

BACKGROUND OF THE INVENTION

Electronic components and devices, such as microprocessors and other various integrated circuits, have advanced in many significant ways. As one example, feature sizes have moved into the sub-micron range thereby allowing larger numbers of transistors to be formed on a given silicon surface area. This, in turn, has resulted in greater device and circuit density on the individual chips. As another example, in part due to the first advance discussed above, microprocessors have increased dramatically in clock speed. At present, microprocessor speeds of 2.5 Gigahertz are coming to market and the 3 and 4 Gigahertz range is rapidly being approached.

Because of the advances in device density and microprocessor speed discussed above, it is now important to minimize any potential delays in the processing of information and to recognize that existing circuits that once operated within tolerable margins may, at the higher clock speeds of newer systems, become the limiting factor in microprocessor performance.

Figure 1:
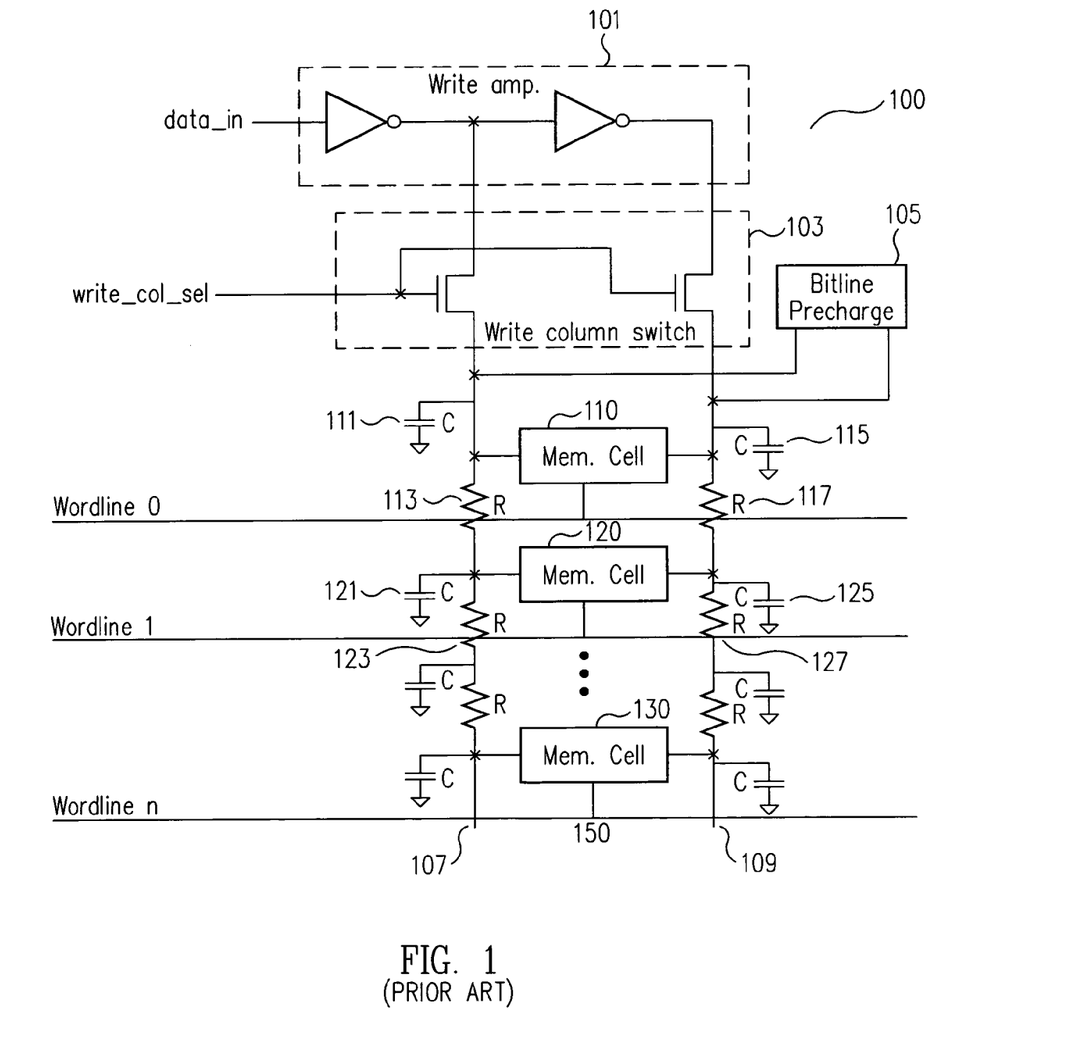
FIG. 1 shows a portion of typical prior art memory array.

One example where higher clock speeds have made prior art circuits and methods inadequate is in the area of memory arrays and, in particular, on-chip memory arrays in microprocessors. FIG. 1 shows a typical prior art memory array 100 including: write amplifier block 101; write column switch 103; bitline pre-charge circuit 105 and memory cells 110, 120, and 130 coupled between bitline pair 107 and 109.

The structure and operation of prior art memory arrays, such as prior art memory array 100, is well known to those of skill in the art and is therefore not discussed in more detail herein to avoid detracting from the present invention.

As shown in FIG. 1, and as is also well known to those of skill in the art, each of memory cells 110, 120, and 130 of prior art memory array 100 included an inherent parasitic capacitance, and bitlines 107 and 109 also include an inherent parasitic capacitance and an inherent resistance. These parasitic capacitances and resistances are shown in FIG. 1 symbolically as parasitic capacitors 111, 115, 121, and 125 and resistors 113, 117, 123 and 127.

A pair of parasitic capacitances, such as capacitors 111, 115, associated with memory cell 110 and bitlines 107 and 109, and an inherent resistance, such as resistors 113, 117, also associated with memory cell 110 and bitlines 107 and 109, are an unavoidable component of each memory cell added to bitline pair 107/109. Consequently, the more memory cells, such as memory cells 110, 120 and 130, that are coupled to bitline pair 107/109, the greater the cumulative parasitic capacitance and resistance there is at end 150 of bitline pair 107/109.

Unfortunately, modern electronic devices are typically requiring larger and higher density memory designs. Consequently, there can be a requirement to increase the number of memory cells connected to a bitline in order to keep a balance between wordline and bitline loads. In addition, to meet a given aspect ratio of a memory array, a designer may need more memory cells to be connected to a bitline. As a result, very long or "tall" bitlines that are very heavily loaded for parasitic resistance and capacitance result.

As noted above, this becomes a problem because, for example, during a write operation, the switching rate of the heavily RC loaded bitlines will be very low, and, as a result, the end of the bitlines, such as end 150 of bitline pair 107/109, may not have time to discharge to a value very close to zero, also called a digital zero or "ground" in the time allotted by the system clock before the next operation. It is important that the bitline discharge to this value very close to zero to ensure that there is enough margin to write to the memory array at the given frequency. As a result, the speed of operation of the memory array, and the entire system, is often slowed down. Of course, as the speed of system clocks increases, this problem becomes even more pronounced as there is even less time between operations for a bitline to discharge from a pre-charged value. In addition, as more and more memory is moved into "on chip" caches, the problem becomes even more immediate and more pronounced because these on-chip memory arrays are expected to operate at even higher speeds than off-chip designs.

To overcome the problems described above with respect to prior art memory array 100, a designer could try adding a an additional write driver, such as write drive block 101 in FIG. 1, in association with additional write column switch 103, to end 150 of prior art memory array 100. This action would effectively cut the number of memory cells on a bitline/bitline pair in half. However, this solution requires more components, uses more precious silicon space and often complicates the design by adding more control signals, routing metal, and synchronization issues. Another method would be to increase the width of bitlines 107 and 109. However, this "solution" would also use more silicon space and would add even more parasitic capacitance to bitlines 107 and 109.

As noted, in the prior art, there were typically fewer memory cells per bitline, the system clock speeds were slower and memory arrays were typically off-chip. However, with the advances discussed above regarding clock speeds and the ability to put more memory on-chip, the prior art memory arrays and methods are rapidly proving inadequate to need the needs of modern electronic systems and devices.

What is needed is a circuit and method for boosting bitline performance that allows long bitlines, with large numbers of memory cells attached, to discharge to a digital zero in a faster time and does not require a significant number of added components, does not require multiple control signals, and takes up minimal additional silicon area.

SUMMARY OF THE INVENTION

The present invention is directed to a circuit and method for boosting bitline performance that uses a bitline booster circuit to allow long bitlines, with large numbers of memory cells attached, to discharge to a digital zero in a faster time. One embodiment of the present invention requires only two additional NOR gates, two additional transistors, and one additional control signal. Consequently, the bitline booster circuit of the invention does not require a significant number of added components, does not require multiple control signals and takes up minimal additional silicon area.

According to the present invention, a booster circuit is added to memory bitlines/bitline pairs to enhance the bitline differential during write operation. Consequently, according to the present invention, the speed of operation of long bitlines/bitline pairs is increased by compensating for the increased parasitic capacitance and resistance.

In one embodiment of the invention, the booster circuit is coupled to the end of the bitline/bitline pair opposite the end coupled to the write amplifier. In one embodiment of the invention, the booster circuit is active only when a signal boost_enable_1 is low.

As discussed in more detail below, in one embodiment of the invention, signal boost_enable_1 is asserted low only during write operation. In one embodiment of the invention, the booster circuit includes two NOR gates and two transistors coupled such that when signal boost_enable_1 is low, i.e., during write operation, a write amplifier will start sending the signal to the bitlines. Based on the input data, one bitline will be transitioning low. According to the present invention, when this bitline starts going low, the booster circuit will switch after the voltage in the bitline has gone below the trip point of the bitline booster circuit, and the bitline booster circuit of the invention will start discharging the bitline.

Unlike the prior art memory arrays discussed above, the bitlines/bitline pairs of memory arrays using the method and apparatus of the invention will discharge to a digital zero fast enough to meet the needs of the newer/faster system clocks. In addition, the booster circuits and methods of the present invention do not require a significant number of added components and do not require multiple control signals. Consequently, the booster circuit and method of the present invention takes up minimal additional silicon area and is particularly well suited for use with on-chip memory arrays.

BRIEF DESCRIPTION OF THE DRAWINGS

The circuit and method for boosting bitline performance of the present invention will be described in the following detailed description, with reference to the accompanying drawings. In the drawings, the same reference numbers are used to denote similar components in the various embodiments.

DETAILED DESCRIPTION

The present invention is directed to a bitline booster circuit (260 in FIG. 2 and FIG. 5, 360 in FIG. 3 and 460 in FIG. 4) and method for boosting bitline performance that allows long bitlines (207/209 in FIGS. 2, 3, 4 and 5), with large numbers of memory cells (210, 220, 230 in FIGS. 2, 3, 4, and 5) attached, to discharge to a digital zero in a faster time. One embodiment of the present invention requires only two additional NOR gates (301 and 311 in FIGS. 3 and 4), two additional transistors (320 and 330 in FIGS. 3 and 4) and one additional control signal (261 in FIGS. 3 and 4). Consequently, the bitline booster circuit of the invention does not require a significant number of added components, does not require multiple control signal and takes up minimal additional silicon area.

According to the present invention, a booster circuit is added to memory bitlines/bitline pairs to enhance the bitline differential during write operation. Consequently, according to the present invention, the speed of operation of long bitlines/bitline pairs is increased by compensating for the increased parasitic capacitance and resistance.

Figure 2:
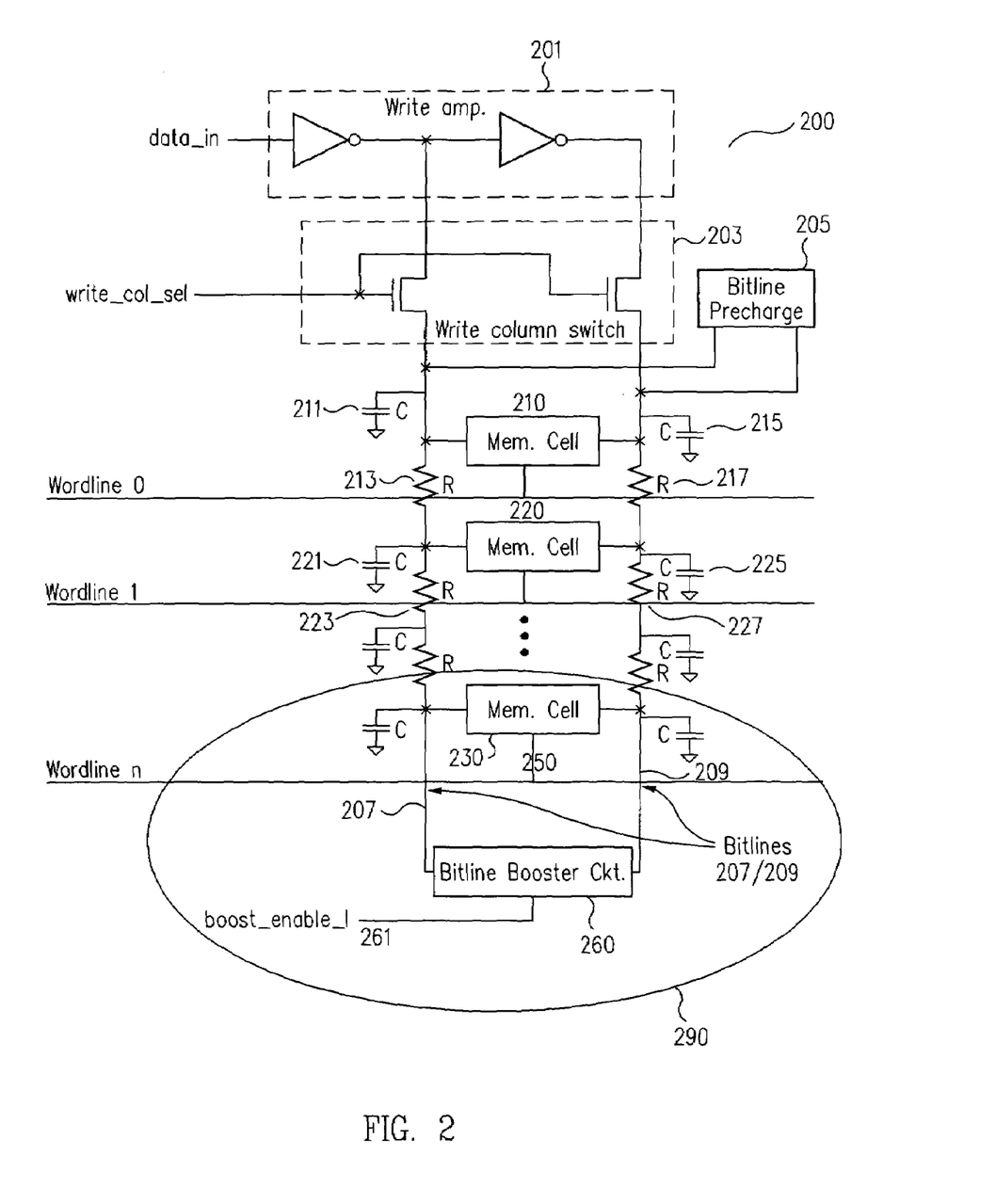
FIG. 2 shows one embodiment of a portion of a boosted memory array including a bitline booster circuit according to the principles of the present invention.
Figure 4:
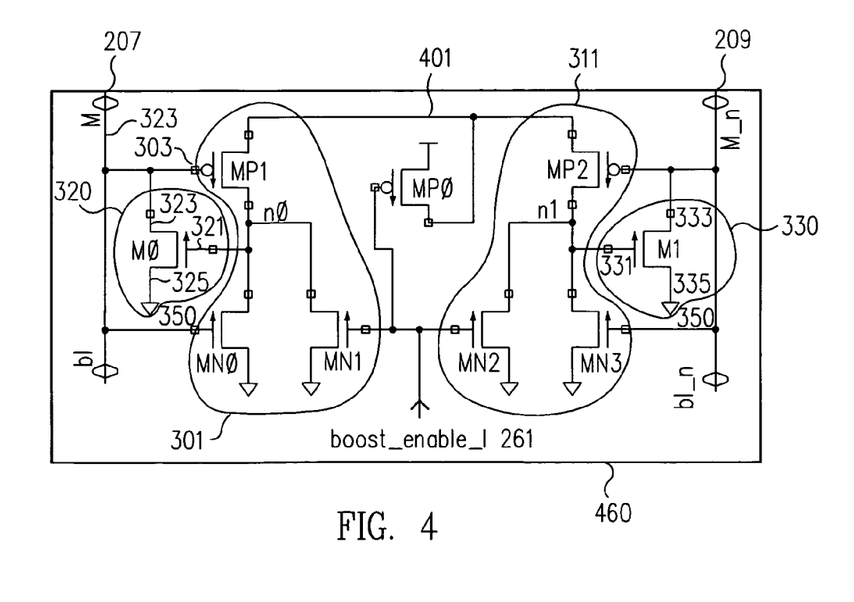
FIG. 4 shows one embodiment of a bitline booster circuit according to the principles of the present invention in further detail.
Figure 5:
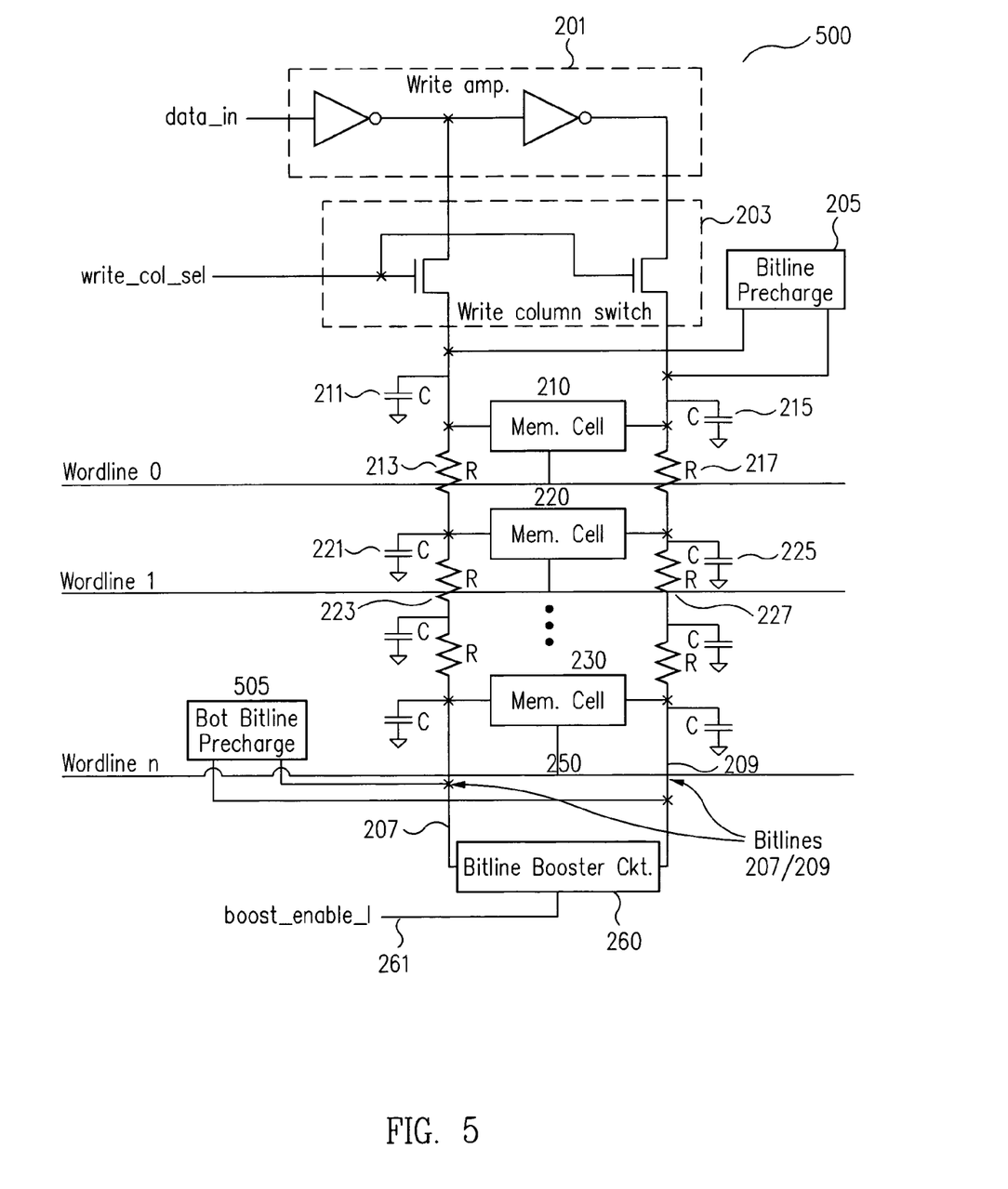
FIG. 5 shows one embodiment of a portion of a boosted memory array including a bitline booster circuit and dual bitline pre-charge circuits according to the principles of the present invention.

In one embodiment of the invention, the booster circuit is coupled to the end of the bitline/bitline pair opposite the end coupled to the write amplifier 201 in FIGS. 2, and 5). In one embodiment of the invention, the booster circuit is active only when a signal boost_enable_1 (261 in FIGS. 2, 3, 4, and 5) is low.

As discussed in more detail below, in one embodiment of the invention, signal boost_enable_1 is asserted low only during write operation. In one embodiment of the invention, the booster circuit includes two NOR gates coupled such that signal boost_enable_1 is low, i.e., during write operation, a write amplifier will start sending the signal to the bitlines. Based on the input data, one bitline will be transitioning low from its pre-charged value. According to the present invention, when the low bitline starts going low, the associated NOR gate of the booster circuit will switch after the voltage in the bitline has gone below the trip point of this NOR gate, and will start discharging the bitline.

In one embodiment of the invention the bitline booster circuit can be controlled through the signal boost_enable_1 to ensure that the bitline booster circuit is not unintentionally activated when it should remain inactive, for instance during a read operation. However, according to one embodiment of the invention, the bitline booster circuit of the invention will remain functional when the signal boost_enable_1 is tired to "ground". In addition, as discussed below with respect to FIG. 6, this effect can be further modified as the fabrication process matures, and the control over the process increases, by the inclusion of inverters, or inverting schmidt triggers, with the booster circuit of the invention.

Unlike the prior art memory arrays discussed above, the bitlines/bitline pairs of memory arrays using the method and apparatus of the invention will discharge to a digital zero fast enough to meet the needs of the newer/faster system clocks. In addition, the booster circuits and methods of the present invention do not require a significant number of added components and do not require multiple control signals. Consequently, the booster circuit and method of the present invention takes up minimal additional silicon area and is particularly well suited for use with on-chip memory arrays.

FIG. 2 shows one embodiment of a portion of a boosted memory array 200 including one embodiment of the bitline booster circuit 260 of the invention. As shown in FIG. 2, boosted memory array 200, like prior art memory array 100, includes: write amplifier block 201; write column switch 203; bitline pre-charge circuit 205 and memory cells 210, 220, and 230 coupled between bitline pair 207 and 209.

The structure and operation of memory arrays, such as the portion of boosted memory array 200 other than bitline booster circuit 260 and signal boost_enable_1, is well known to those of skill in the art and is therefore not discussed in more detail herein to avoid detracting from the present invention.

Also shown in FIG. 2 is inherent parasitic capacitance, such as parasitic capacitors 211, 215, 221, and 225, and inherent resistance, such as resistors 213, 217, 223 and 227. As with prior art memory array 100 discussed above, A pair of parasitic capacitances such as capacitors 211, 215, associated with memory cell 210, and an inherent resistance, such as resistors 213, 217, also associated with memory cell 210, are an unavoidable component of each memory cell added to bitline pair 207/209. Consequently, the more memory cells, such as memory cells 210, 220 and 230, that are coupled to bitline pair 207/209, and are added to boosted memory array 200, the greater the cumulative parasitic capacitance and resistance there is at memory cell 230, and end 250 of bitline pair 207/209. However, as also shown in FIG. 2, according to the present invention, boosted memory cell array 200 also includes bitline booster circuit 260 to overcome this greater cumulative parasitic capacitance and resistance.

According to the present invention, bitline booster circuit 260 is added to bitline pair 207/209 to enhance the bitline differential during a write operation. Consequently, according to the present invention, the speed of operation of bitline pair 207/209 is increased by compensating for the increased parasitic capacitance and resistance.

As shown in FIG. 2, in one embodiment of the invention, bitline booster circuit 260 is coupled to end 250 of bitline pair 207/209, opposite the end coupled to write amplifier 201. In one embodiment of the invention, bitline booster circuit 260 is active only when a signal boost_enable_1 261 is low. As discussed in more detail below, in one embodiment of the invention, signal boost_enable_1 261 is asserted low only during a write operation and bitline booster circuit 260 is coupled such that when signal boost_enable_1 261 is low, i.e., during write operation, write amplifier 201 will start sending a signal to bitlines 207/209. Based on the input data, one bitline, 207 or 209, will be transitioning low. According to the present invention, when the low bitline, 207 or 209, starts going low, bitline booster circuit 260 will start discharging the low bitline.

Unlike the prior art memory arrays discussed above, the bitlines/bitline pairs, such as bitline pair 207/209, of boosted memory arrays, such as boosted memory array 200, using the method and apparatus of the invention will achieve a bitline voltage close to zero, i.e., a digital zero, in time to meet the needs of the newer/faster system clocks. In addition, bitline booster circuits and the methods of the present invention do not require a significant number of added components and do not require multiple control signals. Consequently, bitline booster circuit 260 and the method of the present invention takes up minimal additional silicon area and is particularly well suited for use with on-chip memory arrays.

Figure 3:
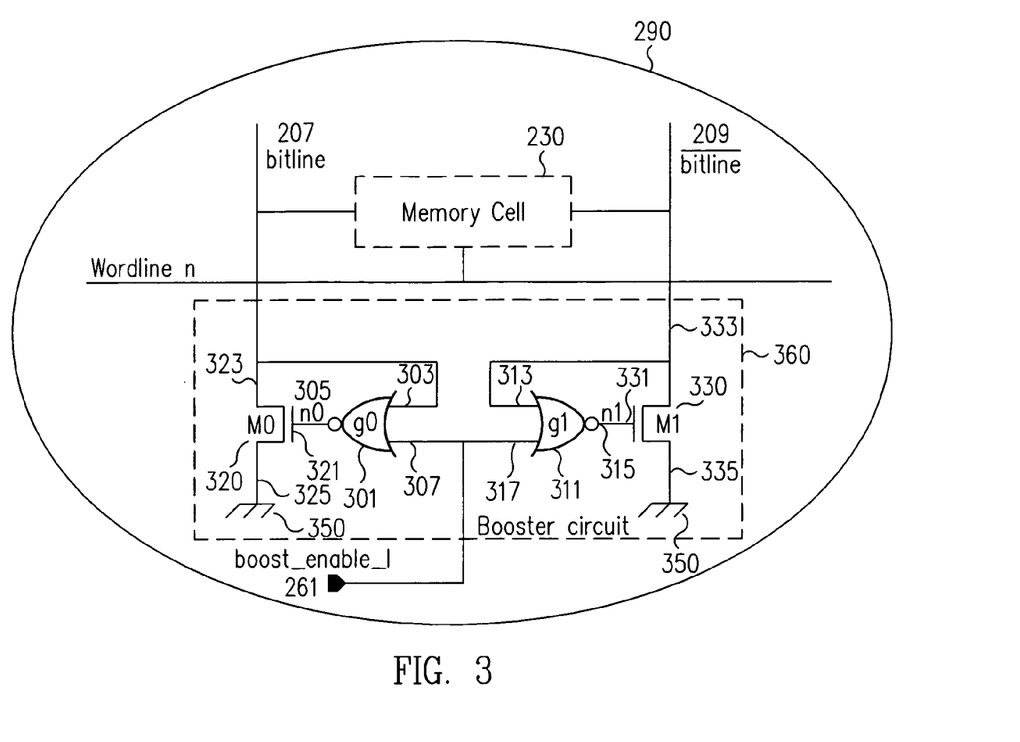
FIG. 3 shows a portion of the boosted memory array of FIG. 2 including detail of one embodiment of a bitline booster circuit according to the principles of the present invention.

FIG. 3 shows portion 290 of the boosted memory array 200 of FIG. 2 including one embodiment 360 of a bitline booster circuit 260 according to the principles of the present invention. As seen in FIG. 3, in one embodiment of the invention, bitline booster circuit 360 includes a first NOR gate 301 and a first transistor 320. A first input 303 of first NOR gate 301 is coupled to bitline 207 and a second input 307 of first NOR gate 301 is coupled to the signal boost_enable_1 261.

An output 305 of first NOR gate 301 is coupled to a control electrode or gate 321 of first transistor 320. A first flow electrode 323 of transistor 320 is coupled to bitline 207 and a second flow electrode 325 of first transistor 320 is coupled to a supply voltage 350.

As also seen in FIG. 3, in one embodiment of the invention, bitline booster circuit 360 includes a second NOR gate 311 and a second transistor 330. A first input 313 of second NOR gate 311 is coupled to bitline 209 and a second input 317 of second NOR gate 311 is coupled to the signal boost_enable_1 261 and the second input 307 of first NOR gate 301.

An output 315 of second NOR gate 311 is coupled to a control electrode or gate 331 of second transistor 330. A first flow electrode 333 of second transistor 330 is coupled to bitline 209 and a second flow electrode 335 of second transistor 330 is coupled to supply voltage 350.

As discussed above, bitline booster circuit 360 is coupled to end 250 of the bitline/bitline pair 207/209 opposite the end coupled to write amplifier 201 (FIG. 2). In one embodiment, bitline booster circuit 360 is active only when signal boost_enable_1 261 is low and signal boost_enable_1 261 is asserted low only during a write operation.

In one embodiment of the invention, when signal boost_enable_1 261 is low, i.e., during write operation, write amplifier 201 (FIG. 2) will start sending the signal to the bitlines 207 and 209. Based on the input data, one bitline, 207 or 209, will be transitioning low. For illustrative purposes, we will assume bitline 207 is going low.

According to the present invention, when bitline 207 starts going low, first NOR gate 301 of bitline booster circuit 360 will switch after the voltage in bitline 207 has gone below the trip point of first NOR gate 301. This, in turn, will cause gate 321 of first transistor 320 to go high, turning on first transistor 320 and discharging bitline 207. Of course, those of skill in the art will readily recognize that the opposite effect will take place if bitline 209 goes low, i.e., when bitline 209 starts going low, second NOR gate 311 of bitline booster circuit 360 will switch after the voltage in bitline 209 has gone below the trip point of second NOR gate 311. This, in turn, will cause gate 331 of second transistor 330 to go high, turning on second transistor 330 and discharging bitline 209. Consequently, bitline booster circuit 360, unlike the prior art memory arrays discussed above, discharges the bitline 207 or 209 to a digital zero fast enough to meet the needs of the newer/faster system clocks with enough design margin. In addition, as shown in FIG. 3, bitline booster circuit 360 requires only two NOR gates, two transistors and one additional signal. Consequently, the booster circuit and method of the present invention takes up minimal additional silicon area and is particularly well suited for use with on-chip microprocessor memory arrays.

FIG. 4 shows one embodiment of a bitline booster circuit 460 according to the principles of the present invention. As shown in FIG. 4, bitline booster circuit 460 includes: first NOR gate 301; first transistor 320; second NOR gate 311; and second transistor 330. It is worth noting that in the one embodiment of bitline booster circuit 460, first NOR gate 301 and second NOR gate 311 share transistor 401 so that one less transistor is required and even more silicon space is saved. However, those of skill in the art will readily recognize that there are potentially many different particular implementations of bitline booster circuits 260, 360 and 460 and that various transistors and other components could be combined to create the desired results as described above according to the principles of the invention.

FIG. 5 shows one embodiment 500 of a portion of a boosted memory array including a bitline booster circuit 260, top bitline pre-charge circuit 205 and bottom bitline pre-charge circuit 505 according to the principles of the present invention.

As shown in FIG. 5, boosted memory array 500, like boosted memory array 200, includes: write amplifier block 201; write column switch 203; bitline pre-charge circuit 205 and memory cells 210, 220, and 230 coupled between bitline pair 207/209. The structure, and operation, of boosted memory array 500 is almost identical to boosted memory array 200 discussed above with respect to FIG. 2. However, boosted memory array 500 includes an additional bottom bitline pre-charge circuit 505 along with top bitline pre-charge circuit 205 of boosted memory array 200. Bottom bitline pre-charge circuit 505 is included in boosted memory array 500 to help bitlines 207 and 209 equalize faster and thereby provide an even faster memory array 500.

In one embodiment of the invention the bitline booster circuit of the invention can be controlled through the signal boost_enable_1 to ensure that the bitline booster circuit is not unintentionally activated when it should remain inactive, for instance during a read operation. However, according one embodiment of the invention, the bitline booster circuit of the invention will remain functional when the signal boost_enable_1 is tied to "ground". In addition, this effect can be further modified as the fabrication process matures, and the control over the process increases, by the inclusion of inverters, or inverting Schmidt triggers, with the booster circuit of the invention.

Figure 6:
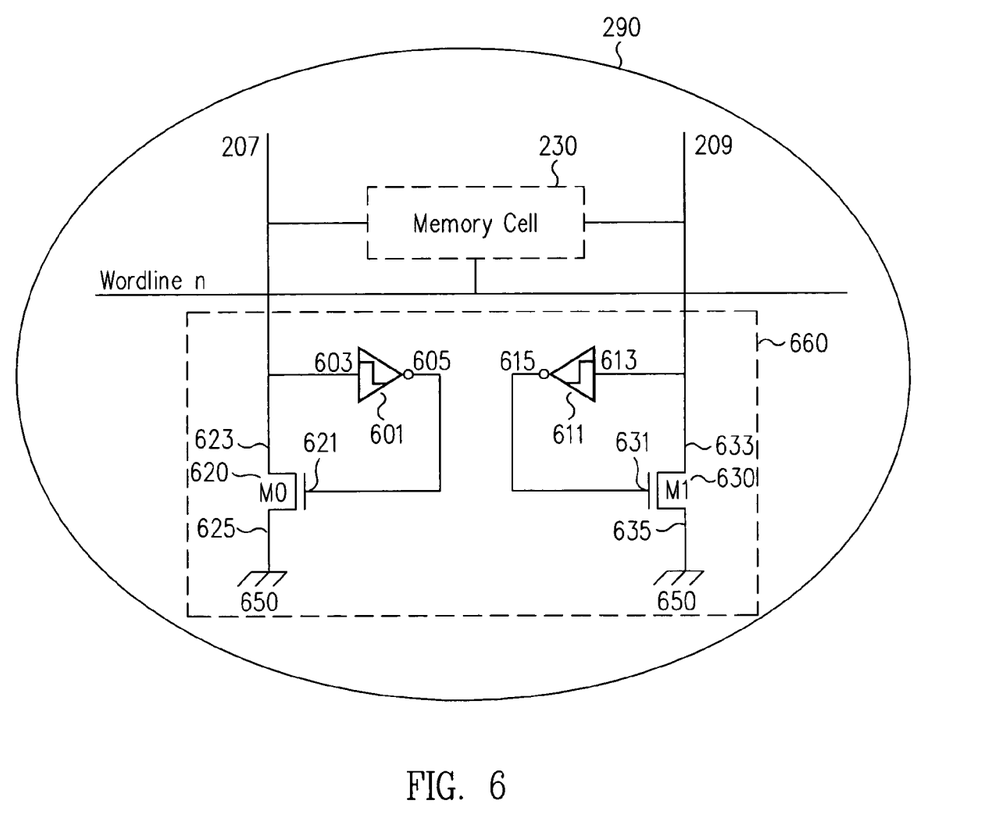

FIG. 6 shows another embodiment of portion 290 of the boosted memory array 200 of FIG. 2 including another embodiment 660 of a bitline booster circuit 260 according to the principles of the present invention. As seen in FIG. 6, in this embodiment of the invention, bitline booster circuit 660 includes a first inverter 601 and a first transistor 620. An input 603 of first inverter 601 is coupled to bitline 207. An output 605 of first inverter 601 is coupled to a control electrode or gate 621 of first transistor 620. A first flow electrode 623 of transistor 620 is coupled to bitline 207 and a second flow electrode 625 of first transistor 620 is coupled to a supply voltage 650.

As also seen in FIG. 6, in one embodiment of the invention, bitline booster circuit 660 includes a second inverter 611 and a second transistor 630. An input 613 of second inverter 611 is coupled to bitline 209. An output 615 of second inverter 611 is coupled to a control electrode or gate 631 of second transistor 630. A first flow electrode 633 of second transistor 630 is coupled to bitline 209 and a second flow electrode 635 of second transistor 630 is coupled to supply voltage 650.

As discussed above, bitline booster circuit 660 is coupled to end 250 of the bitline/bitline pair 207/209 opposite the end coupled to write amplifier 201 (FIG. 2). In this embodiment of the invention bitline booster circuit 660 does not rely on the signal boost_enable_1—1 to ensure bitline booster circuit 660 does not turn on when not intended, such as during a read operation. This embodiment is particularly advantageous as the fabrication process matures and the control over the process grows high.

Those of skill in the art will readily recognize that the principles of the present invention can be easily applied to memory arrays or register files that employ a "single ended" write and therefore employ a single bitline as opposed to a bitline pair. In these instances, those of skill in the art will recognize that with minor modifications, the bitline booster circuit and methods of the invention can be used to equally increase the performance of single bitline systems.

As discussed above, the present invention is directed to a bitline boosting circuit and method for boosting bitline performance that allows long bitlines, with large numbers of memory cells attached, to discharge to a digital zero in a faster time. As also discussed above, one embodiment of the present invention requires only two additional NOR gates, two additional transistors, and one additional control signal. Consequently, the bitline booster circuit of the invention does not require a significant number of added components, does not require multiple control signal and takes up minimal additional silicon area.

According to the present invention, the booster circuit is added to memory bitlines/bitline pairs to enhance the bitline differential during write operation. Consequently, according to the present invention, the speed of operation of long bitlines/bitline pairs is increased by compensating for the increased parasitic capacitance and resistance.

In one embodiment of the invention, the booster circuit is coupled to the end of the bitline/bitline pair opposite the end coupled to the write amplifier. In one embodiment of the invention, the booster circuit is active only when a signal boost_enable_1 is low and, in one embodiment of the invention, signal boost_enable_1 is asserted low only during write operation. In one embodiment of the invention, the booster circuit includes two NOR gates coupled such that signal boost_enable_1 is low, i.e., during write operation, the write amplifier will start sending the signal to the bitlines. Based on the input data, one bitline will be transitioning low. According to the present invention, when the bitline starts going low, the associated NOR gate of the booster circuit will switch after the voltage in the bitline has gone below the trip point of this NOR gate, and the bitline booster circuit of the invention will start discharging the bitline.

Unlike the prior art memory arrays discussed above, the bitlines/bitline pairs of memory arrays using the method and apparatus of the invention will achieve a digital zero in time to meet the needs of the newer/faster system clocks. In addition, the booster circuits and methods of the present invention do not require a significant number of added components and do not require multiple control signals. Consequently, the booster circuit and method of the present invention takes up minimal additional silicon area and is particularly well suited for use with on-chip memory arrays.

It should be recognized that, while the present invention has been described in relation to the specific embodiments thereof discussed above, those skilled in the art might develop a wide variation of structural and operational details without departing from the principles of the invention.

As one example, the structure of the portion of the memory array shown in FIGS. 2 and 5 is exemplary only and could be varied to meet the needs of the designer by methods well known to those of skill in the art. In addition, the number of memory cells shown is exemplary only and is not limited to the number of cells shown or recited.

As another example, while as discussed above, one embodiment of the invention uses NOR gates and transistors of a first polarity to make up the bitline booster circuit of the invention, those of skill in the art could use other known logic combinations to achieve the same results.

In addition, those of skill in the art will readily recognize that there are many different particular implementations of bitline booster circuits 260, 360 and 460 and that various transistors and other components could be combined to create the desired results described above according to the principles of the invention.

In addition, those of skill in the art will readily recognize that the principles of the present invention can be easily applied to memory arrays or register files that employ a "single ended" write and therefore employ a single bitline as opposed to a bitline pair. In these instances, those of skill in the art will recognize that with minor modifications, the bitline booster circuit and methods of the invention can be used to equally increase the performance of single bitline systems.

Consequently, the present invention should not be read as being limited the particular embodiments discussed above or the particular properties discussed above that were chosen for illustrative purposes only.

What is claimed is:

1. The A boosted memory array comprising:
   at least one bitline;
   at least one memory cell coupled to said bitline;
   a bitline booster circuit coupled to said bitline;
   a bitline booster circuit bitline boost enable signal input terminal coupled to said bitline booster circuit;
   a bitline boost enable signal coupled to said bitline booster circuit bitline boost enable signal input terminal, wherein;
   when said bitline boost enable signal is active and a signal on said at least one bitline starts going low, said bitline booster circuit discharges said at least one bitline, further wherein;
   said boosted memory array includes at least two bitlines, a first bitline and a second bitline, further wherein;
   said bitline booster circuit comprises:
   a first NOR gate, a first input of said first NOR gate being coupled to said first bitline and a second input of said first NOR gate being coupled to said bitline boost enable signal;
   a first transistor, an output of said first NOR gate being coupled to a control electrode of said first transistor, a first flow electrode of said first transistor being coupled said first bitline, a second flow electrode of said first transistor being coupled to a supply voltage;
   a second NOR gate, a second input of said second NOR gate being coupled to said second bitline and a second input of said second NOR gate being coupled to said bitline boost enable signal; and
   a second transistor, an output of said second NOR gate being coupled to a control electrode of said second transistor, a first flow electrode of said second transistor being coupled said second bitline, a second flow electrode of said second transistor being coupled to said supply voltage.

2. The boosted memory array of claim 1, wherein;
   said first and second transistors are NFETS and said supply voltage is ground.

3. The boosted memory array of claim 1, wherein;
   said boosted memory array is on the same silicon chip as a microprocessor.

4. A microprocessor chip, said microprocessor chip comprising:
   one or more functional blocks; and
   a boosted memory array, said boosted memory array comprising:
   at least one bitline;
   at least one memory cell coupled to said bitline;
   a bitline booster circuit coupled to said bitline;
   a bitline booster circuit bitline boost enable signal input terminal coupled to said bitline booster circuit;
   a bitline boost enable signal coupled to said bitline booster circuit bitline boost enable signal input terminal, wherein;
   when said bitline boost enable signal is active and a signal on said at least one bitline starts going low, said bitline booster circuit discharges said at least one bitline, further wherein:
   said boosted memory array includes at least two bitlines, a first bitline and a second bitline, further wherein;
   said bitline boost enable signal is active only during write operation, further wherein;
   said bitline booster circuit comprises:
   a first NOR gate, a first input of said first NOR gate being coupled to said first bitline and a second input of said first NOR gate being coupled to said bitline boost enable signal;
   a first transistor, an output of said first NOR gate being coupled to a control electrode of said first transistor, a first flow electrode of said first transistor being coupled said first bitline, a second flow electrode of said first transistor being coupled to a supply voltage;
   a second NOR gate, a first input of said second NOR gate being coupled to said second bitline and a second input of said second NOR gate being coupled to said bitline boost enable signal; and
   a second transistor, an output of said second NOR gate being coupled to a control electrode of said second transistor, a first flow electrode of said second transistor being coupled said second bitline, a second flow electrode of said second transistor being coupled to said supply voltage.

5. The microprocessor chip of claim 4, wherein;
   said first and second transistors are NFETS and said supply voltage is ground.

6. A method for boosting the performance of a memory array comprising:
   providing at least one bitline;
   coupling at least one memory cell to said at least one bitline;
   coupling a bitline booster circuit to said at least one bitline;
   coupling a bitline booster circuit bitline boost enable signal input terminal to said bitline booster circuit;
   coupling a bitline boost enable signal to said bitline booster circuit bitline boost enable signal input terminal, such that;
   when said bitline boost enable signal is active and a signal on said at least one bitline starts going low, said bitline booster circuit discharges said at least one bitline, wherein;
   said boosted memory array includes at least two bitlines, a first bitline and a second bitline, further wherein;
   said bitline boost enable signal is active only during write operation, further wherein;
   said bitline booster circuit comprises:
   a first NOR gate, a first input of said first NOR gate being coupled to said first bitline and a second input of said first NOR gate being coupled to said bitline boost enable signal;
   a first transistor, an output of said first NOR gate being coupled to a control electrode of said first transistor, a first flow electrode of said first transistor being coupled said first bitline, a second flow electrode of said first transistor being coupled to a supply voltage;
   a second NOR gate, a first input of said second NOR gate being coupled to said second bitline and a second input of said second NOR gate being coupled to said bitline boost enable signal; and
   a second transistor, an output of said second NOR gate being coupled to a control electrode of said second transistor, a first flow electrode of said second transistor being coupled said second bitline, a second flow electrode of said second transistor being coupled to said supply voltage.

7. The method for boosting the performance of a memory array of claim 6, wherein;

said first and second transistors are NFETS and said supply voltage is ground.

8. The method for boosting the performance of a memory array of claim 6, wherein;
said boosted memory array is on the same silicon chip as a microprocessor.

9. A method for improving the performance of a microprocessor chip, said method comprising:
providing one or more functional blocks on said microprocessor chip;
providing a boosted memory array, said boosted memory array comprising:
at least one bitline;
at least one memory cell coupled to said bitline;
a bitline booster circuit coupled to said bitline;
a bitline booster circuit bitline boost enable signal input terminal coupled to said bitline booster circuit;
a bitline boost enable signal coupled to said bitline booster circuit bitline boost enable signal input terminal, wherein;
when said bitline boost enable signal is active and a signal on said at least one bitline starts going low, said bitline booster circuit discharges said at least one bitline, further wherein;
said bitline boost enable signal is active only during write operation, further wherein;
said bitline booster circuit comprises:
a first NOR gate, a first input of said first NOR gate being coupled to said first bitline and a second input of said first NOR gate being coupled to said bitline boost enable signal;
a first transistor, an output of said first NOR gate being coupled to a control electrode of said first transistor, a first flow electrode of said first transistor being coupled said first bitline, a second flow electrode of said first transistor being coupled to a supply voltage;
a second NOR gate, a first input of said second NOR gate being coupled to said second bitline and a second input of said second NOR gate being coupled to said bitline boost enable signal; and
a second transistor, an output of said second NOR gate being coupled to a control electrode of said second transistor, a first flow electrode of said second transistor being coupled said second bitline, a second flow electrode of said second transistor being coupled to said supply voltage.

10. The method for improving the performance of a microprocessor chip of claim 9, wherein;
said first and second transistors are NFETS and said supply voltage is ground.

* * * * *